United States Patent
Kang et al.

(10) Patent No.: US 12,000,891 B2
(45) Date of Patent: Jun. 4, 2024

(54) SCAN CORRELATION-AWARE SCAN CLUSTER REORDERING METHOD AND APPARATUS FOR LOW-POWER TESTING

(71) Applicant: UIF (University Industry Foundation), Yonsei University, Seoul (KR)

(72) Inventors: Sungho Kang, Seoul (KR); Sang Jun Lee, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 39 days.

(21) Appl. No.: 17/931,044

(22) Filed: Sep. 9, 2022

(65) Prior Publication Data
US 2023/0125568 A1 Apr. 27, 2023

(30) Foreign Application Priority Data
Oct. 26, 2021 (KR) .......................... 10-2021-0143401

(51) Int. Cl.
*G01R 31/3185* (2006.01)
(52) U.S. Cl.
CPC ................ *G01R 31/318538* (2013.01); *G01R 31/318555* (2013.01)
(58) Field of Classification Search
None
See application file for complete search history.

(56) References Cited

U.S. PATENT DOCUMENTS

| 10,621,043 | B2 | 4/2020 | Casper et al. |
| 11,507,721 | B2* | 11/2022 | Abdul ................. G06F 18/2415 |
| 2008/0195904 | A1* | 8/2008 | Wang ............. G01R 31/318547 |
| | | | 714/E11.159 |
| 2009/0217117 | A1* | 8/2009 | Chmelar ........ G01R 31/318544 |
| | | | 714/729 |
| 2009/0288045 | A1* | 11/2009 | Chien ................... G06F 30/327 |
| | | | 716/103 |
| 2010/0218060 | A1* | 8/2010 | Nakako .......... G01R 31/318544 |
| | | | 714/E11.155 |

(Continued)

FOREIGN PATENT DOCUMENTS

| KR | 10-1539712 B1 | 7/2015 |
| KR | 10-1681862 B1 | 12/2016 |
| KR | 10-2273138 B1 | 7/2021 |

OTHER PUBLICATIONS

Lee S, Cho K, Kim J, Park J, Lee I, Kang S. Low-Power Scan Correlation-Aware Scan Cluster Reordering for Wireless Sensor Networks. Sensors (Basel). Sep. 12, 2021;21(18):6111. doi: 10.3390/s21186111. PMID: 34577317; PMCID: PMC8472869. (Year: 2021).*

(Continued)

*Primary Examiner* — Daniel F. McMahon
(74) *Attorney, Agent, or Firm* — BROADVIEW IP LAW, PC

(57) ABSTRACT

The exemplary embodiments of the present invention provides a scan cluster reordering method and apparatus which perform a scan correlation aware scan cluster reordering to reduce a power generated during the scan test and place scan cells having a high correlation to be adjacent to each other by analyzing the correlation between scan cells, and reduce a test power generated during the scan test.

8 Claims, 4 Drawing Sheets

(56) References Cited

U.S. PATENT DOCUMENTS

2012/0117436 A1* 5/2012 Portolan ........ G01R 31/318563
714/738
2017/0185922 A1* 6/2017 Lange .................... G06N 20/00
2021/0333853 A1* 10/2021 Wakefield ................ G06F 1/26
2021/0373077 A1* 12/2021 Liu ................ G01R 31/318555

OTHER PUBLICATIONS

Sangjun Lee et al.,"Low-Power Scan Correlation-Aware Scan Cluster Reordering for Wireless Sensor Networks", Sensors 2021, 21, 6111. https://doi.org//10.3390/s21186111, Sep. 12, 2021.

* cited by examiner

SCAN CORRELATION-AWARE SCAN CLUSTER REORDERING METHOD AND APPARATUS FOR LOW-POWER TESTING

CROSS-REFERENCE TO RELATED APPLICATIONS

This application claims priority to and the benefit of Korean Patent Application No. 10-2021-0143401 filed in the Korean Intellectual Property Office on Oct. 26, 2021, the entire contents of which are incorporated herein by reference.

BACKGROUND

Field

The technical field of the present invention relates to a scan cluster reordering method and apparatus. This work was supported by the MOTIE and KEIT [20012010, Design for Test of Intelligent Processors].

Description of the Related Art

The contents described in this section merely provide background information on the present exemplary embodiment but do not constitute the related art.

A scan structure is a testing method which is the most widely used and in recent years, in accordance with the increased size of the circuit, power consumption during the test is increased more than a power consumption during a normal operation. Due to this problem, a reliability problem of the scan test is caused and a low power scan structure is demanded.

A scan chain reordering method for low power testing may be roughly classified into a test pattern based method and a method of analyzing a logic topology. The test pattern based method is a method that uses a test pattern and changes a scan order to make the power consumption generated during the scan test with the pattern lowest and a method of analyzing a logic topology is a method that analyzes gates in a circuit to predict a circuit operation to reduce a test power regardless of a test pattern.

RELATED ART DOCUMENT

Patent Document (Patent Document 1) KR 10-2273138 (2021 Jun. 29)
(Patent Document 2) KR 10-1539712 (2015 Jul. 21)
(Patent Document 3) KR 10-1681862 (2016 Nov. 25)

SUMMARY

Main objects of the exemplary embodiments of the present invention are to perform a scan correlation aware scan cluster reordering to reduce a power generated during the scan test and place scan cells having a high correlation to be adjacent to each other by analyzing the correlation between scan cells, and reduce a test power generated during the scan test.

Other and further objects of the present disclosure which are not specifically described can be further considered within the scope easily deduced from the following detailed description and the effect.

According to an aspect of the present embodiment, a scan cluster reordering method includes: constructing a distance matrix between scan cells using a test pattern; performing the scan correlation clustering using the constructed distance matrix and acquiring a hierarchical structure as a clustering result; and performing scan chain reordering using the hierarchical structure.

In the constructing of a distance matrix, an unassigned bit (X-bit) of the test pattern is filled with zero (0-filling).

In the constructing of a distance matrix, a distance matrix is generated for every scan chain and a normalized hamming distance is applied.

In the constructing of a distance matrix, distance matrices for an input vector and an output vector of the test pattern are generated, a first distance matrix for the input vector is output, and a second distance matrix for the output vector is output.

In the constructing of a distance matrix, a first weight for the input vector is calculated, a second weight for the output vector is calculated, and the first weight is applied to the first distance matrix and the second weight is applied to the second distance matrix and added to calculate a total distance matrix.

A relative standard deviation obtained by dividing the standard deviation by a mean value may be applied to the first weight and the second weight.

As the scan correlation clustering, a hierarchical agglomerative clustering (HAC) may be performed based on the smallest distance in the distance matrix.

in the step of acquiring a hierarchical structure, a dendrogram tree is output as the clustering result.

In the step of performing the scan chain reordering, a scan cell order is determined in accordance with the order of the cluster corresponding to the hierarchical structure.

According to another aspect of the present embodiment, a scan cluster reordering apparatus including a processor is provided. the processor constructs a distance matrix between scan cells using a test pattern, performs the scan correlation clustering using the constructed distance matrix and acquires a hierarchical structure as a clustering result; and performs scan chain reordering using the hierarchical structure.

The processor places scan cells having a high correlation to be adjacent to each other using the constructed distance matrix and determines a scan cell order in the order of the cluster according to the hierarchical structure.

As described above, according to the exemplary embodiments of the present invention, distance information is extracted from correlation between scan cells using a test pattern and an order of the scan cells is determined by a clustering method to merge scan cells which are adjacent to each other, thereby reducing a test power.

Even if the effects are not explicitly mentioned here, the effects described in the following specification which are expected by the technical features of the present disclosure and their potential effects are handled as described in the specification of the present disclosure.

DETAILED DESCRIPTION OF THE EMBODIMENT

Hereinafter, in the description of the present disclosure, a detailed description of the related known functions will be omitted if it is determined that the gist of the present disclosure may be unnecessarily blurred as it is obvious to those skilled in the art and some exemplary embodiments of the present disclosure will be described in detail with reference to exemplary drawings.

Figure 1:
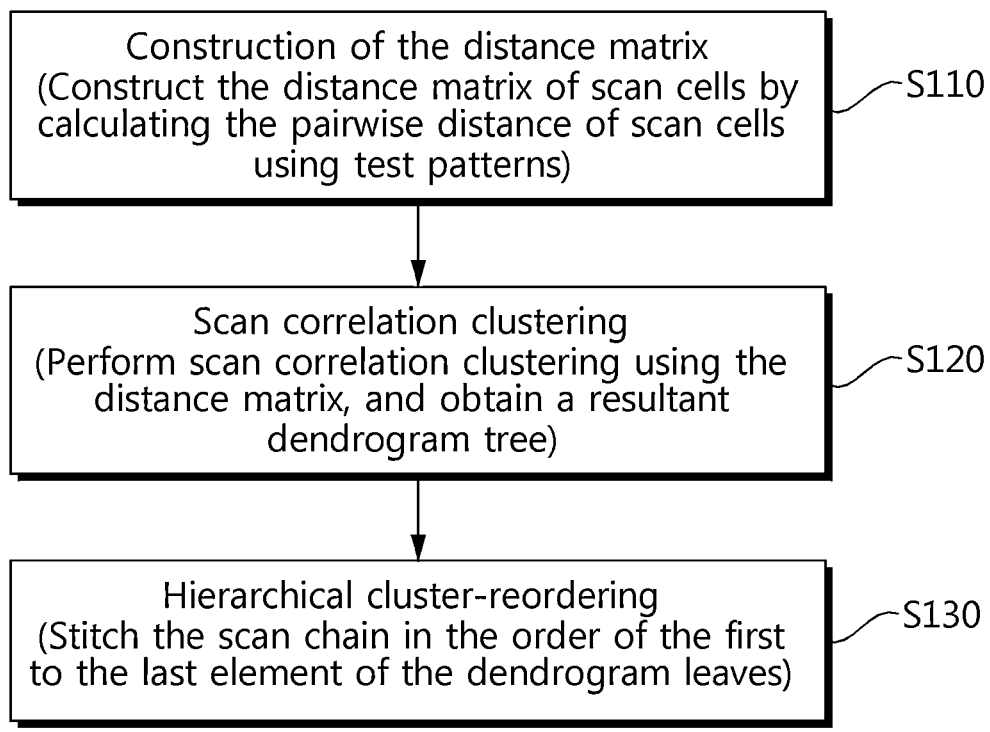
FIG. 1 is a view illustrating an operation of a scan cluster reordering apparatus according to an exemplary embodiment of the present invention.

FIG. 1 is a view illustrating an operation of a scan cluster reordering apparatus according to an exemplary embodiment of the present invention.

The scan cluster reordering apparatus places scan cells having a high correlation to be adjacent to each other by analyzing a correlation between scan cells during a process of designing a circuit and reduces a test power generated during the scan test. After inserting a scan by a conventional alphabetical ordering manner, a test pattern is generated and a scan cell order is determined based on test data information of the test pattern so as to reduce a test power.

In step S110, a distance matrix between the scan cells is constructed using test patterns. In step S120, a scan correlation clustering is performed using the distance matrix constructed in the previous step and a dendrogram tree is obtained as the clustering result. In step S130, scan chain reordering is performed based on the result of the dendrogram tree.

Figure 2:
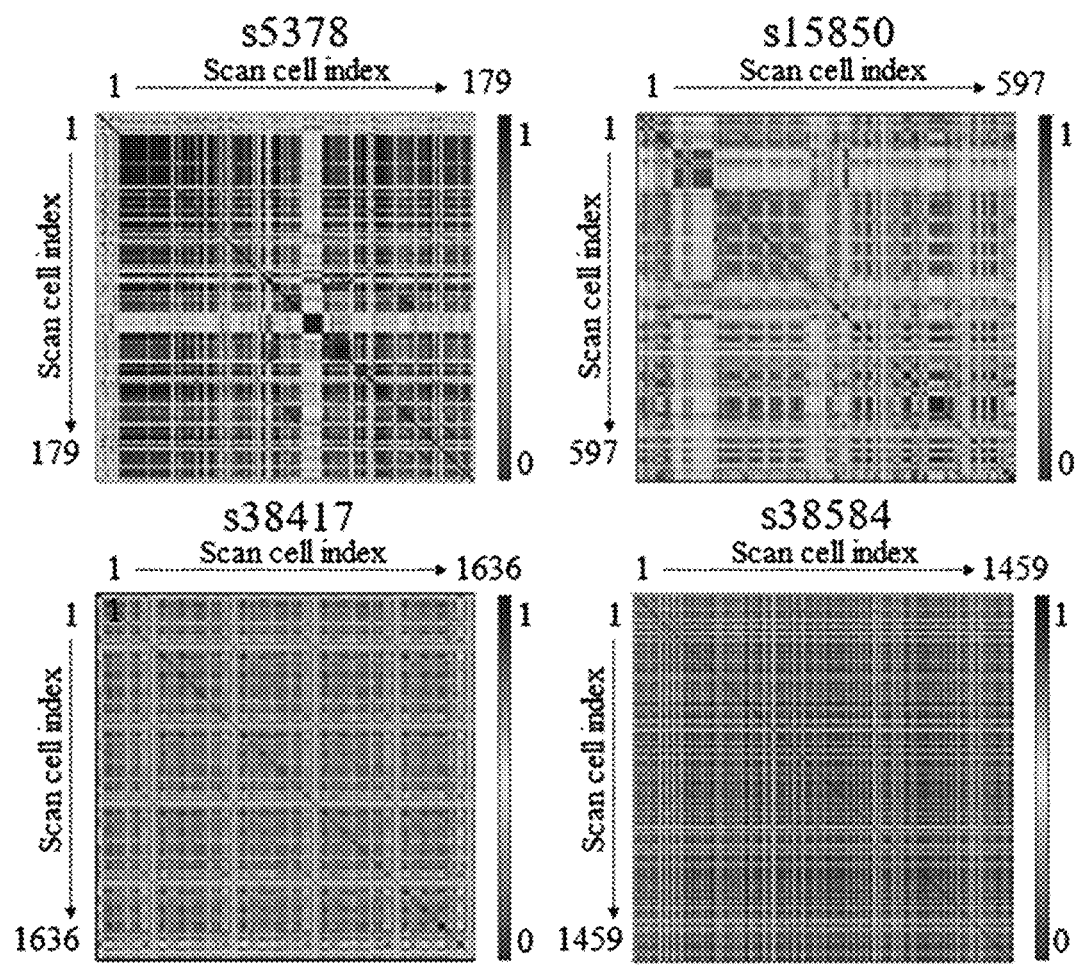
FIG. 2 is a view illustrating a correlation between scan cells in a test pattern for every circuit which is processed by a scan cluster reordering apparatus according to an exemplary embodiment of the present invention on a heat map graph.

FIG. 2 is a view illustrating a correlation between scan cells in a test pattern for every circuit which is processed by a scan cluster reordering apparatus according to an exemplary embodiment of the present invention on a heat map graph.

A correlation between scan cells of the test pattern according to the conventional alphabetical ordering manner is calculated and the correlation is represented from 0 to 1. The heat map is shown such that when the correlation is completely opposite, the correlation is 0 and when the correlation is completely the same, the correlation is 1 and it is changed from red to green for every number. It can be found from the heat map that the correlation is distributed without any tendency. When the correlation between adjacent scan cells is low, the power generated during the test is increased so that it is necessary to cluster scan cells having a similar correlation.

Table 1 illustrates an algorithm of constructing a distance matrix between scan cells.

TABLE 1

| Algorithm 1 Construction of the distance matrix |
|---|
| 1: input : test patterns (input_vector(fill-0) & response_vector) |
| 2:   A set of scan cells {$FF_1$, ...,$FF_n$} |
| 3: k = the number of test patterns |
| 4: # Construct the normalized hamming distance matrix of input and response |
| 5: for i = 1 to n do |
| 6:   for j = 1 to n do |
| 7:     input_dist_matrix(i, j) = H($FF_i$, $FF_j$) of input_vector / k |
| 8:     response_dist_matrix(i, j) = H($FF_i$, $FF_j$) of response_vector / k |

TABLE 1-continued

| Algorithm 1 Construction of the distance matrix |
|---|
| 9:   end for |
| 10: end for |
| 11: # Determine the weight of  input/output_dist_matrix |
| 12: input_weight = RSD (standard deviation/mean) of |
| 13:           adjacent scan cell's correlation of input vector |
| 14: response_weight = RSD (standard deviation/mean) of |
| 15:           adjacent scan cell's correlation of response vector |
| 16: # Construct the total hamming distance matrix |
| 17: total_dist_matrix = input_weight * input_dist_matrix + |
| 18:           response_weight * response_dist_matrix |
| 19: return total_dist_matrix |

It is necessary to concentrate on reducing shift power and capture power is also important, so the created test pattern is filled with 0-filling. A distance matrix of scan cells is generated using an input vector and an output vector of the test pattern and is calculated as a normalized hamming distance.

The input vector and the output vector are separately calculated and the distance matrix is generated for every scan chain. A total distance matrix is generated by adding both the input vector and the output vector. At this time, weights of the distance matrix for the input and the output are determined by a standard deviation/mean value which is a relative standard deviation (RSD) of the distance matrix to multiply the weight and add them to calculate a final distance matrix. The reason of calculating the weight is to determine a more important value between the input and the output to apply a higher weight thereto and reduce a test power.

Table 2 illustrates a scan correlation clustering algorithm using a distance matrix.

TABLE 2

| Algorithm 2 Scan correlation clustering |
|---|
| 1: input: total distance matrix |
| 2: # Assign each scan cell to its own cluster |
| 3: for i =1 to n |
| 4:     $c_i$ = {$x_i$} |
| 5: end for |
| 6: C = {$c_1$, ...,$c_n$} |
| 7: # Repeatedly selecting and merging pairs of clusters |
| 8: while C.size > 1 do |
| 9:     ($c_{min1}$, $c_{min2}$) = minimum dist($c_i$,$c_j$) for all $c_i$,$c_j$ in C |
| 10:    remove $c_{min1}$ and $c_{min2}$ from C |
| 11:    add {$c_{min1}$, $c_{min2}$} to C |
| 12: end while |
| 13: return dendrogram tree |

The corresponding cluster algorithm uses a hierarchical agglomerative clustering (HAC) algorithm. A cluster for each scan cell is created and clusters having the shortest distance are merged one by one based on a value of the distance matrix. It is continuously repeated one by one until last one cluster remains. By doing this, when one cluster remains, a dendrogram tree is completed and an order of the scan cells in the cluster becomes a scan order of the scan correlation aware scan cluster reordering.

Figure 3:
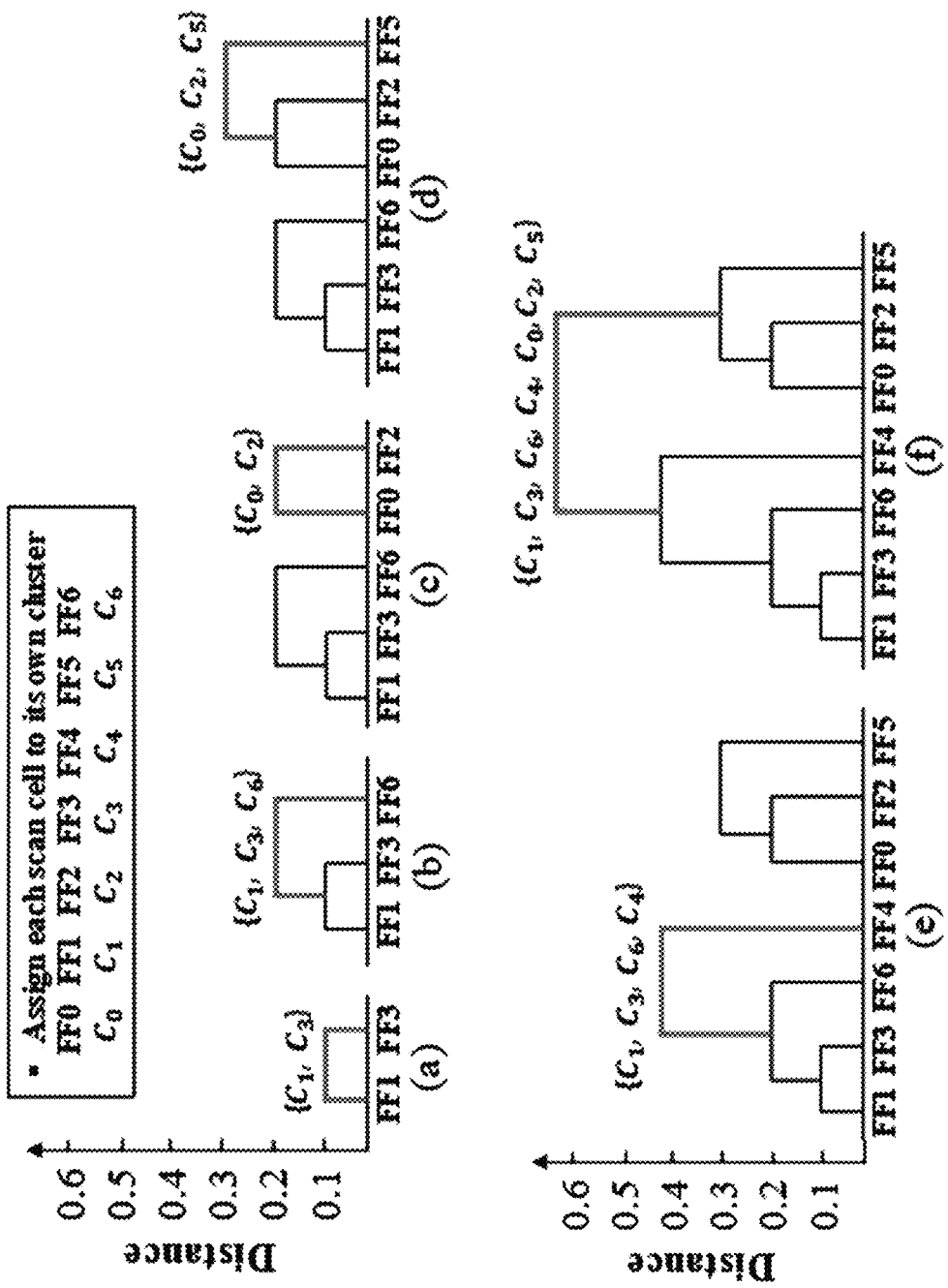
FIG. 3 is a view illustrating a scan correlation clustering processed by a scan cluster reordering apparatus according to an exemplary embodiment of the present invention.

FIG. 3 is a view illustrating a scan correlation clustering processed by a scan cluster reordering apparatus according to an exemplary embodiment of the present invention.

For example, there are a total of seven scan cells and first, each scan cell is assigned to one cluster. It can be seen that the clustering algorithm is applied while progressing from FIG. 3(a) to FIG. 3(f) and clusters which are closest to each other are merged one by one. When the final clustering ends, as illustrated in FIG. 3(f), scan cells are merged by one cluster and the scan cell order is determined by the order of the corresponding cluster.

Figure 4:
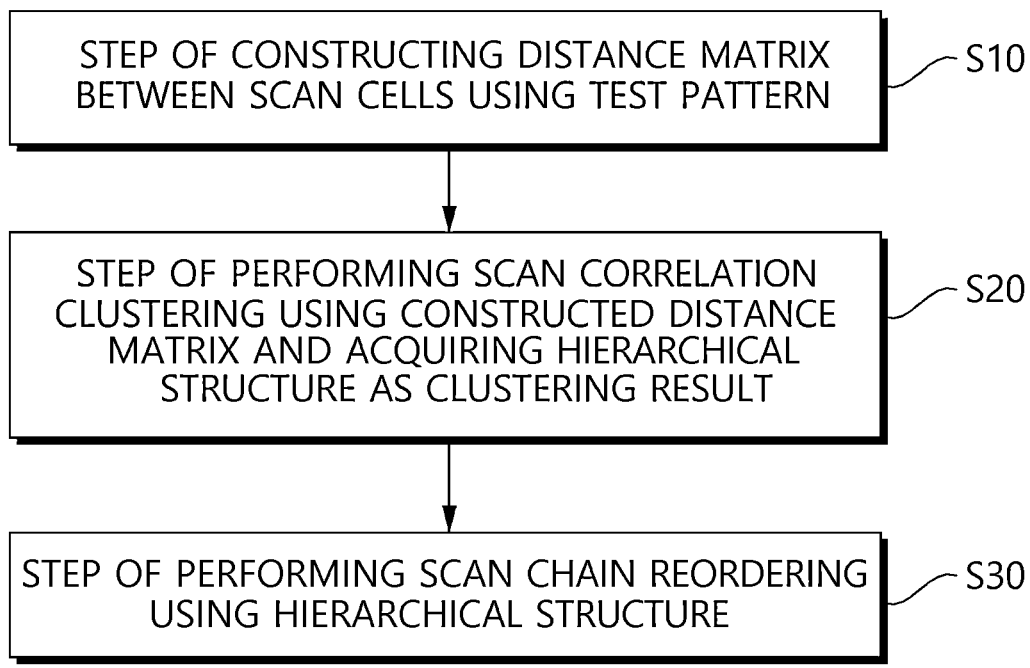
FIG. 4 is a flowchart illustrating a scan cluster reordering method according to another exemplary embodiment of the present invention.

FIG. 4 is a flowchart illustrating a scan cluster reordering method according to another exemplary embodiment of the present invention.

The scan cluster reordering method may be performed by a scan cluster reordering apparatus.

In step S10, a step of constructing a distance matrix between the scan cells using a test pattern is performed. In the step of constructing a distance matrix, an un-assigned bit X-bit of the test pattern is filled with zero (0-filling). In the step of constructing a distance matrix, a distance matrix is generated for every scan chain and a normalized hamming distance may be applied. In the step of constructing a distance matrix, distance matrices for the input vector and the output vector of the test pattern are generated and a first distance matrix for the input vector is output and a second distance matrix for the output vector is output. In the step of constructing a distance matrix, a first weight for the input vector is calculated, a second weight for the output vector is calculated, the first weight is applied to the first distance matrix and the second weight is applied to the second distance matrix and added to calculate a total distance matrix. A relative standard deviation obtained by dividing the standard deviation by a mean value may be applied to the first weight and the second weight.

In step S20, a step of performing the scan correlation clustering using the constructed distance matrix and acquiring a hierarchical structure as a clustering result is performed. As the scan correlation clustering, a hierarchical agglomerative clustering (HAC) may be performed based on the smallest distance in the distance matrix. In the step of acquiring a hierarchical structure, a dendrogram tree may be output as the clustering result.

In step S30, a step of performing scan chain reordering using a hierarchical structure is performed. In the step of performing scan chain reordering, the scan cell order may be determined in the order of the cluster according to the hierarchical structure.

According to the present exemplary embodiments, voltage drop which becomes a problem during the scan test and the test reliability problem which is caused due to excessive power consumption are reduced so that it is expected to improve the yield in the process and the test power may be effectively reduced using the correlation. When the test structure is designed, it takes less time to apply the algorithm and the power generated during the scan test may be reduced.

The scan cluster reordering apparatus may include at least one processor, a computer readable recording medium, and a communication bus.

The processor may be controlled to operate as a scan cluster reordering apparatus. For example, the processor may execute one or more programs stored in the computer readable storage medium. One or more programs may include one or more computer executable command and the computer executable command may be configured to allow the scan cluster reordering to perform the operations according to the exemplary embodiments when it is executed by the processor.

The computer readable storage medium is configured to store a computer executable command or program code, program data and/or other appropriate format of information. A computer executable instruction or program code, program data and/or other appropriate type of information may also be provided by an input/output interface or a communication interface. The program stored in the computer readable storage medium includes a set of commands which are executable by the processor. In one exemplary embodiment, the computer readable storage medium may be a memory (a volatile memory such as a random access memory, a non-volatile memory, or an appropriate combination thereof), one or more magnetic disk storage devices, optical disk storage devices, flash memory devices, and another format of storage mediums which is accessed by the scan cluster reordering and stores desired information, or an appropriate combination thereof.

The communication bus includes the processor and the computer readable storage medium to connect various components of the scan cluster reordering.

The scan cluster reordering apparatus may include one or more input/output interfaces and one or more communication interfaces which provide an interface for one or more input/output devices. The input/output interface and the communication interface are connected to the communication bus. The input/output device may be connected to the other components of the scan cluster reordering apparatus via the input/output interface.

The scan cluster reordering apparatus may be implemented in a logic circuit by hardware, firm ware, software, or a combination thereof or may be implemented using a general purpose or special purpose computer. The apparatus may be implemented using hardwired device, field programmable gate array (FPGA) or application specific integrated circuit (ASIC). Further, the apparatus may be implemented by a system on chip (SoC) including one or more processors and a controller.

The scan cluster reordering apparatus may be mounted in a computing device or a server provided with a hardware element as a software, a hardware, or a combination thereof. The computing device or server may refer to various devices including all or some of a communication device for communicating with various devices and wired/wireless communication networks such as a communication modem, a memory which stores data for executing programs, and a microprocessor which executes programs to perform operations and commands.

In FIGS. 1 and 4, the respective processes are sequentially performed, but this is merely illustrative and those skilled in the art may apply various modifications and changes by changing the order illustrated in FIGS. 1 and 4 or performing one or more processes in parallel or adding another process without departing from the essential gist of the exemplary embodiment of the present disclosure.

The operation according to the exemplary embodiment of the present disclosure may be implemented as a program instruction which may be executed by various computers to be recorded in a computer readable medium. The computer readable medium indicates an arbitrary medium which participates to provide a command to a processor for execution. The computer readable medium may include solely a program command, a data file, and a data structure or a combination thereof. For example, the computer readable medium may include a magnetic medium, an optical recording medium, and a memory. The computer program may be distributed on a networked computer system so that the computer readable code may be stored and executed in a distributed manner Functional programs, codes, and code segments for implementing the present embodiment may be easily inferred by programmers in the art to which this embodiment belongs.

The present embodiments are provided to explain the technical spirit of the present embodiment and the scope of the technical spirit of the present embodiment is not limited by these embodiments. The protection scope of the present embodiments should be interpreted based on the following appended claims and it should be appreciated that all technical spirits included within a range equivalent thereto are included in the protection scope of the present embodiments.

What is claimed is:

1. A scan cluster reordering method, comprising:
   constructing a distance matrix between scan cells using a test pattern;
   performing scan correlation clustering using the constructed distance matrix and acquiring a hierarchical structure as a clustering result; and
   performing scan chain reordering using the hierarchical structure,
   wherein as the scan correlation clustering, a hierarchical agglomerative clustering (HAC) is performed based on the smallest distance in the distance matrix,
   wherein in the acquiring a hierarchical structure, a dendrogram tree is output as a clustering result.

2. The scan cluster reordering method according to claim 1, wherein an unassigned bit (X-bit) of the test pattern is filled with zero (0-filling).

3. The scan cluster reordering method according to claim 1, wherein a distance matrix is generated for every scan chain and a normalized hamming distance is applied.

4. The scan cluster reordering method according to claim 1, wherein distance matrices for an input vector and an output vector of the test pattern are generated, a first distance matrix for the input vector is output, and a second distance matrix for the output vector is output.

5. The scan cluster reordering method according to claim 4, wherein a first weight for the input vector is calculated, a second weight for the output vector is calculated, and the first weight is applied to the first distance matrix and the second weight is applied to the second distance matrix and added to calculate a total distance matrix.

6. The scan cluster reordering method according to claim 5, wherein a relative standard deviation obtained by dividing a standard deviation by a mean value is applied to the first weight and the second weight.

7. The scan cluster reordering method according to claim 1, wherein a scan cell order is determined in accordance with the order of the cluster corresponding to the hierarchical structure.

8. A scan cluster reordering apparatus including a processor,
   wherein the processor constructs a distance matrix between scan cells using a test pattern, performs scan correlation clustering using the constructed distance matrix and acquires a hierarchical structure as a clustering result, and performs scan chain reordering using the hierarchical structure,
   wherein as the scan correlation clustering, a hierarchical agglomerative clustering (HAC) is performed based on the smallest distance in the distance matrix,
   wherein the processor, a dendrogram tree is output as a clustering result.

* * * * *